(12) United States Patent
Farmer et al.

(10) Patent No.: US 8,786,018 B2
(45) Date of Patent: Jul. 22, 2014

(54) SELF-ALIGNED CARBON NANOSTRUCTURE FIELD EFFECT TRANSISTORS USING SELECTIVE DIELECTRIC DEPOSITION

(75) Inventors: Damon B. Farmer, White Plains, NY (US); Aaron D. Franklin, Croton-on-Hudson, NY (US); Shu-Jen Han, Cortlandt Manor, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 13/610,158

(22) Filed: Sep. 11, 2012

(65) Prior Publication Data

US 2014/0070284 A1    Mar. 13, 2014

(51) Int. Cl.
*H01L 29/786*    (2006.01)
*H01L 21/336*    (2006.01)

(52) U.S. Cl.
CPC .... *H01L 29/78669* (2013.01); *H01L 29/78678* (2013.01); *H01L 29/78696* (2013.01); *Y10S 977/742* (2013.01)
USPC ............. 257/347; 438/158; 977/742

(58) Field of Classification Search
CPC  B82Y 10/00; H01L 51/0048; H01L 51/0545; G01N 27/4146
USPC ............ 977/742; 257/330, 24, 347, E27.112; 438/270, 589
See application file for complete search history.

(56) References Cited

U.S. PATENT DOCUMENTS

| | | | |
|---|---|---|---|
| 6,617,561 B1* | 9/2003 | Wei et al. .................... | 250/208.1 |
| 6,891,227 B2 | 5/2005 | Appenzeller et al. | |
| 7,030,001 B2* | 4/2006 | Adetutu et al. ............... | 438/585 |
| 7,078,296 B2 | 7/2006 | Chau et al. | |
| 7,304,357 B2* | 12/2007 | Jaiprakash et al. .......... | 257/415 |
| 7,368,791 B2* | 5/2008 | Zhang et al. .................. | 257/401 |
| 7,622,732 B1* | 11/2009 | Tombler, Jr. ....................... | 257/9 |
| 7,652,342 B2* | 1/2010 | Bertin ........................... | 257/415 |
| 7,652,745 B2* | 1/2010 | Chae et al. .................... | 349/187 |
| 7,714,386 B2 | 5/2010 | Pesetski et al. | |

(Continued)

OTHER PUBLICATIONS

A. Javey et al., "Self-Aligned Ballistic Molecular Transistors and Electrically Parallel Nanotube Arrays," ACS Nano Letters, May 2004, pp. 1319-1322, vol. 4, No. 7.
Z. Zhang et al., "Self-Aligned Ballistic n-Type Single-Walled Carbon Nanotube Field-Effect Transistors with Adjustable Threshold Voltage," ACS Nano Letters, Sep. 2008, pp. 3696-3701, vol. 8, No. 11.
L. Ding et al., "Self-Aligned U-Gate Carbon Nanotube Field-Effect Transistor with Extremely Small Parasitic Capacitance and Drain-Induced Barrier Lowering," ACS Nano Letters, Apr. 2011, pp. 2512-2519, vol. 5, No. 4.
A.D. Franklin et al., "Current Scaling in Aligned Carbon Nanotube Array Transistors with Local Bottom Gating," IEEE Electron Device Letters, Jul. 2010, pp. 644-646, vol. 31, No. 7.
A. Javey et al., "Carbon Nanotube Field-Effect Transistors with Integrated Ohmic Contacts and High-κ Gate Dielectrics," ACS Nano Letters, Jan. 2004, pp. 447-450, vol. 4, No. 3.

*Primary Examiner* — Olik Chaudhuri
*Assistant Examiner* — Pauline Vu
(74) *Attorney, Agent, or Firm* — Vazken Alexanian; Ryan, Mason & Lewis, LLP

(57) ABSTRACT

Self-aligned carbon nanostructure field effect transistor structures are provided, which are formed using selective dielectric deposition techniques. For example, a transistor device includes an insulating substrate and a gate electrode embedded in the insulating substrate. A dielectric deposition-prohibiting layer is formed on a surface of the insulating substrate surrounding the gate electrode. A gate dielectric is selectively formed on the gate electrode. A channel structure (such as a carbon nanostructure) is disposed on the gate dielectric A passivation layer is selectively formed on the gate dielectric. Source and drain contacts are formed on opposing sides of the passivation layer in contact with the channel structure. The dielectric deposition-prohibiting layer prevents deposition of dielectric material on a surface of the insulating layer surrounding the gate electrode when selectively forming the gate dielectric and passivation layer.

20 Claims, 7 Drawing Sheets

(56) References Cited

U.S. PATENT DOCUMENTS

| | | | |
|---|---|---|---|
| 7,763,951 B2 * | 7/2010 | Zijlstra et al. | 257/529 |
| 2005/0212014 A1 * | 9/2005 | Horibe et al. | 257/213 |
| 2008/0173864 A1 * | 7/2008 | Fujita et al. | 257/40 |
| 2009/0101962 A1 * | 4/2009 | Hong et al. | 257/322 |
| 2009/0236675 A1 | 9/2009 | Yang et al. | |
| 2009/0272965 A1 * | 11/2009 | Rachmady et al. | 257/24 |
| 2011/0003453 A1 * | 1/2011 | Jang | 438/381 |
| 2011/0068323 A1 * | 3/2011 | Chen et al. | 257/24 |
| 2012/0007054 A1 | 1/2012 | Chang et al. | |

* cited by examiner

SELF-ALIGNED CARBON NANOSTRUCTURE FIELD EFFECT TRANSISTORS USING SELECTIVE DIELECTRIC DEPOSITION

TECHNICAL FIELD

The field relates generally to carbon nanostructure field effect transistors and methods for constructing self-aligned carbon nanostructure field effect transistor structures using selective dielectric deposition techniques.

BACKGROUND

The integration of carbon nanostructures as channel materials in the next generation of electronic devices offers many advantages over the continued scaling of silicon (Si). Carbon nanostructures such as carbon nanotubes are a nanoscale form of carbon that exhibits extremely high current carrying capacity and mobilities, which are several orders of magnitude beyond the theoretical limit for Si. Furthermore, carbon nanotubes are low-dimensional (ultra-thin-body) materials, which allows them to be aggressively scaled in FETs (field-effect transistors) without incurring deleterious short-channel effects that hinder modern scaled devices.

For carbon nanotube field-effect transistors (CNTFETs) to be technologically relevant for highly integrated digital applications, it is important to realize a robust self-aligned device structure. Conventional self-aligned transistors, such as all current CMOS technology devices, make use of a pre-formed gate region as a mask for implanting source and drain contacts. Because the gate acts as an implant mask, the source and drain are formed in direct and consistent proximity to the gate, thus, self-aligned. A self-aligned device is critical because it ensures uniformity of key parameters such as parasitic capacitance, thus enabling uniform operation of the transistors across a chip. However, these conventional techniques are not applicable for nanotube field-effect transistors.

SUMMARY

Aspects of the invention include carbon nanostructure field effect transistors and methods for constructing self-aligned carbon nanostructure field effect transistor structures using selective dielectric deposition techniques.

In one aspect, a transistor device includes an insulating layer formed on a substrate and a gate electrode embedded in the insulating layer. A dielectric deposition-prohibiting layer is formed on a surface of the insulating layer surrounding the gate electrode. A gate dielectric is selectively formed on the gate electrode. A channel structure (such as a carbon nanostructure) is disposed on the gate dielectric. A passivation layer is selectively formed on the gate dielectric. Source and drain contacts are formed on opposing sides of the passivation layer in contact with the channel structure. The dielectric deposition-prohibiting layer prevents deposition of dielectric material on a surface of the insulating layer surrounding the gate electrode when selectively forming the gate dielectric and passivation layer.

In another aspect, a method of forming a transistor device includes forming a gate electrode in an insulating layer on a substrate, forming a dielectric deposition-prohibiting layer on a surface of the insulating layer surrounding the gate electrode, selectively forming a gate dielectric layer on the gate electrode using the dielectric deposition-prohibiting layer to prevent deposition of dielectric material on a surface of the insulating layer surrounding the gate electrode when forming the gate dielectric layer, forming a channel structure comprising a carbon nanostructure disposed on the gate dielectric layer, selectively forming a passivation layer on the gate dielectric layer to cover a portion of the channel structure that is disposed on the gate dielectric layer, wherein the dielectric deposition-prohibiting layer prevents deposition of dielectric material on a surface of the insulating layer surrounding the gate electrode when forming the passivation layer, and foaming source and drain contacts on opposing sides of the passivation layer in contact with the channel structure.

These and other aspects of the present invention will become apparent from the following detailed description of preferred embodiments, which is to be read in conjunction with the accompanying figures.

BRIEF DESCRIPTION OF THE DRAWINGS

FIGS. 2A, 2B, 2C, 2D, 2E, 2F, 2G, 2H, 2I, 2J, 2K and 2L schematically illustrate methods for constructing a self-aligned carbon nanostructure transistor device, according to exemplary embodiments of the invention, wherein:

FIG. 2A is a cross-sectional view of a carbon nanostructure transistor device at an initial stage of fabrication where a trench is etched into an insulating substrate defining a gate region;

FIG. 2B is a cross-sectional view of the structure of FIG. 2A after depositing a first layer of conductive material to fill the trench;

FIG. 2C is a cross-sectional view of the structure of FIG. 2B after etching the first layer of conductive material layer to form a gate electrode in the insulating substrate;

FIG. 2D is a cross-sectional view of the structure of FIG. 2C after forming a dielectric deposition-prohibiting on the surface of the insulating substrate;

FIG. 2E is a cross-sectional view of the structure of FIG. 2D after selectively forming a gate dielectric layer on the gate electrode;

FIG. 2F is a cross-sectional view of the structure of FIG. 2E after placing a carbon nanostructure structure on the gate dielectric layer over the gate electrode;

FIG. 2G is a top view of the structure shown in FIG. 2F;

FIG. 2H is a cross-sectional view of the structure of FIG. 2G after selectively forming a passivation dielectric layer on the gate dielectric layer over the gate electrode;

FIG. 2I is a cross-sectional view of the structure of FIG. 2H after blanket depositing a second layer of conductive material over the surface of the structure;

FIG. 2J is a cross-sectional view of the structure of FIG. 2I showing the second layer of conductive material being polished down to the passivation dielectric layer using a chemical mechanical polishing process to form source/drain contacts as shown in FIG. 1;

FIG. 2K is a cross-sectional view of the structure of FIG. 2I after forming a photolithographic mask having an opening aligned to the gate electrode and using the mask to etch the second layer of conductive material (exposed through the mask) down to the passivation dielectric layer to foam source/drain contacts; and FIG. 2L is a cross-sectional view of the structure of FIG. 2H after depositing a thin layer of conductive material to form separate source/drain contacts.

DETAILED DESCRIPTION OF PREFERRED EMBODIMENTS

Preferred embodiments of the invention will now be described in further detail with reference to self-aligned carbon nanostructure field effect transistor structures that are constructed using selective dielectric deposition techniques.

Figure 1:
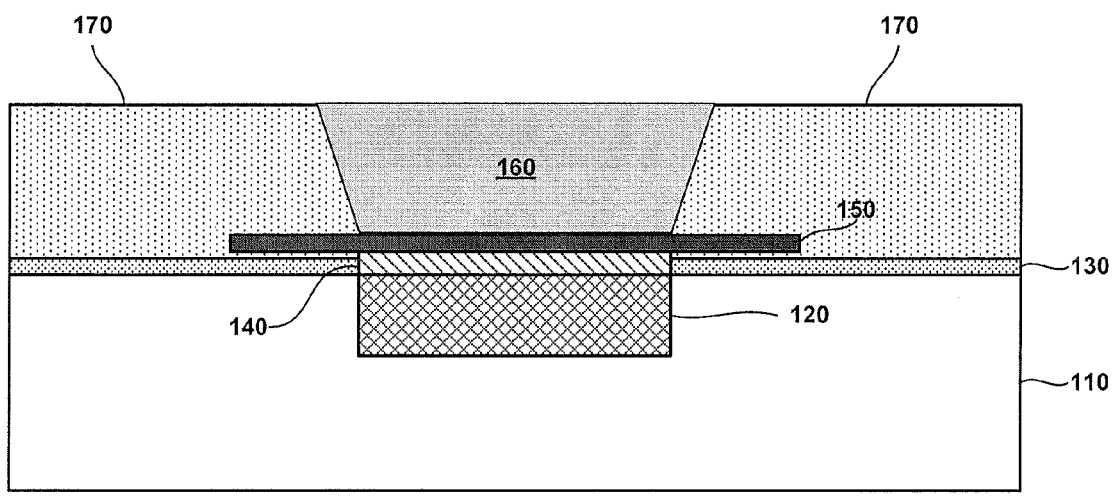
FIG. 1 is a cross-sectional view of a self-aligned carbon nanostructure transistor device, according to an exemplary embodiment of the invention.

For example, FIG. 1 is a cross-sectional view of a self-aligned carbon nanostructure transistor device, according to an exemplary embodiment of the invention. In particular, FIG. 1 shows a field effect transistor 100 comprising an insulating substrate 110, a gate electrode 120, a dielectric deposition-prohibiting layer 130, a gate dielectric layer 140, a channel 150 comprising a carbon nanostructure, a passivation dielectric layer 160 formed on the gate dielectric layer 140 and channel 150, and source/drain contacts 170 in contact with the channel 150. The insulating substrate 110 may be an insulting layer (e.g., silicon dioxide) that is formed on a semiconductor substrate (e.g., silicon). The gate electrode 120 is embedded in the insulating substrate 110, thereby providing a local bottom gated transistor structure.

In the device geometry of FIG. 1, the dielectric deposition-prohibiting layer 130 enables selective dielectric deposition in a local bottom gated CNTFET structure to achieve self-alignment in a manner that is not dependent on lift-off or metal thicknesses. More specifically, in accordance with embodiments of the invention, the dielectric deposition-prohibiting layer 130 is formed over the surface of the insulating substrate 110 surrounding the gate electrode 120. The dielectric deposition-prohibiting layer 130 serves to prohibit the deposition of dielectric material (e.g., atomic layer deposition (ALD) of a high-k dielectric) on the surface of the substrate 110, while allowing the dielectric material to be selectively deposited onto the gate electrode 120 to form the gate dielectric layer 140. This process enables self-alignment in transistor structure with extremely scalable gate dielectric thickness and without limitation on gate or source/drain contact thicknesses.

It is to be noted that self-alignment techniques for constructing bottom gated CNTFET structures using a dielectric deposition-prohibiting layer, according to embodiments of the invention, are in stark contrast to self-alignment techniques for top-gated transistor structures, which require dielectric coating on top of a nanotube. A major disadvantage of top-gated CNTFET transistor structures is that it requires an ultrathin gate dielectric to be formed directly on a carbon nanotube channel, which is extremely difficult and not readily achievable because the inert nanotube surface prohibits the reactive deposition of dielectric material thereon.

FIGS. 2A, 2B, 2C, 2D, 2E, 2F, 2G, 2H, 2I, 2J, 2K and 2L schematically illustrate methods for constructing a self-aligned carbon nanotube transistor device, according to exemplary embodiments of the invention. In particular, FIGS. 2A, 2B, 2C, 2D, 2E, 2F, 2G, 2H, 2I, 2J, 2K and 2L are cross-sectional views of a portion of a self-aligned carbon nanotube transistor device 100 of FIG. 1 at various stages of fabrication.

Figure 2A:
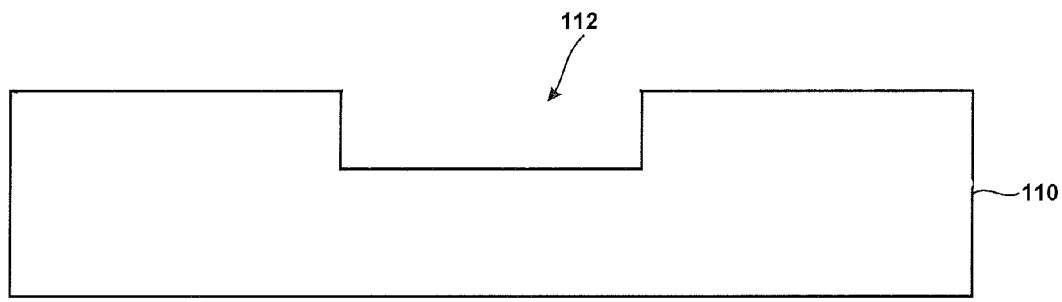

FIG. 2A is a cross-sectional view of a carbon nanostructure transistor device at an initial stage of fabrication where a trench 112 is etched into an insulating substrate 110 defining a gate region. As noted above, insulating substrate 110 may be a layer of insulating material that is formed over a bulk semiconductor substrate (not specifically shown). The insulating substrate layer 110 can be formed of an oxide material such as $SiO_2$ or a nitride material such as $Si_3N_4$. The insulating substrate layer 110 should have a thickness that is sufficient to accommodate the thickness of the embedded local bottom gate electrode that will be formed therein, while providing a sufficient insulating property. The trench 112 can be etched in the insulating substrate layer 110 using known techniques that are suitable for etching the type of insulating material used to form the substrate 110. For example, the trench 112 may be formed using photolithographic techniques to form a photoresist mask having an opening that defines the trench 112, and then using a dry etch process to etch the portion of the insulating substrate 110 (exposed through the photoresist mask) to a desired depth that defines a thickness of the gate electrode to be subsequently formed. For example, the insulating substrate 110 may be etched using a dry anisotropic etch process, such as an RIE (reactive ion etch) process, or any other etch process that is commonly used to etch the material forming the material forming the insulating substrate layer 110.

Figure 2B:
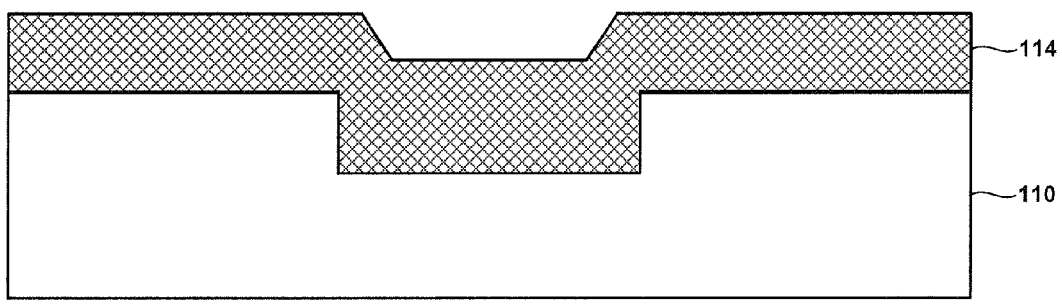
Figure 2C:
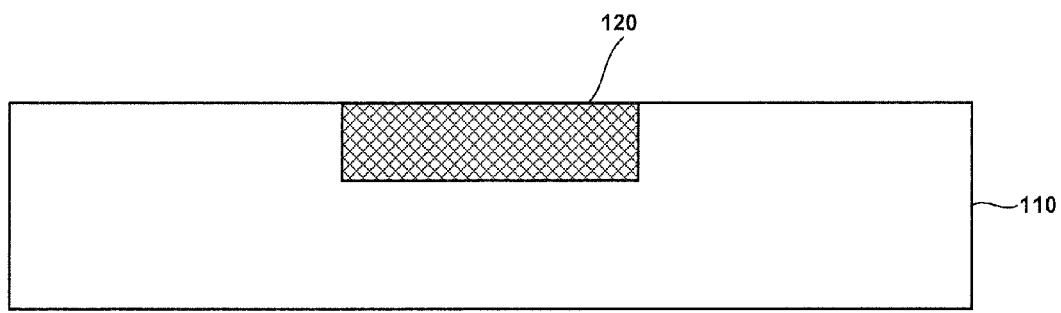

A next step in the process flow, such as shown in FIGS. 2A and 2B, is to form an embedded gate electrode 120 in the insulating substrate layer 110. In particular, FIG. 2B is a cross-sectional view of the structure of FIG. 2A after depositing a first layer of conductive material 114 (gate material) to fill the trench 112, and FIG. 2C is a cross-sectional view of the structure of FIG. 2B after etching the first layer of conductive material 114 to form embedded gate electrode 120 in the insulating substrate layer 110. The gate electrode 120 may be formed of one or more types of metallic material and deposited using known methods. For example, gate electrode material 114 may be formed of a metal material or a combination of metals deposited, e.g., using sputtering or electron beam evaporation. Any known metals commonly used to form gate electrode can be used and the particular metals selected may vary for p-channel and n-channel devices to tune the threshold voltage accordingly. By way of example only, suitable gate metals include, but are not limited to gold (Au), aluminum (Al), titanium (Ti) and/or palladium (Pd). Alternatively, the gate electrode material 114 may be formed of poly-silicon (poly-Si), wherein the poly-Si can be doped to attain a desired work function and conductivity. The techniques for poly-Si gate doping are known to those of skill in the art and thus are not described further herein.

The first layer of conductive material 114 can be etched or otherwise removed from the surface of the insulating substrate 110 using known techniques such that the embedded gate electrode 120 is formed flush with the surface of the insulating substrate 110, as shown in FIG. 2C. By way of example, the first layer of conductive material 114 can be removed by chemical mechanical polishing (CMP), which planarizes the surface of the insulating substrate layer 110 and makes the embedded gate electrode 120 flush with the surface of the insulating substrate layer 110.

Figure 2D:
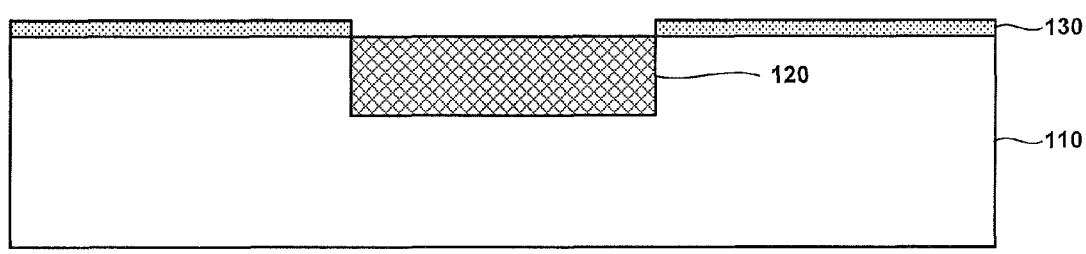

A next step in the process is to treat the surface of the insulating substrate layer 110 with a material that will prohibit the deposition or growth of a dielectric material that is subsequently used to form a gate dielectric layer. In particular, FIG. 2D is a cross-sectional view of the structure of FIG. 2C after forming a dielectric deposition-prohibiting layer 130 on the surface of the insulating substrate 110 surrounding the gate electrode 120. The dielectric deposition-prohibiting layer 130 can be formed with any suitable material such as graphene, a molecular self-assembled monolayer (SAM) or a hydrophobic monolayer (e.g. HMDS), or any other suitable material that can prevent chemical reactive deposition of dielectric material on the regions of the insulating substrate layer 110 surrounding the gate electrode 120. The dielectric deposition-prohibiting layer 130 is uniformly and selectively formed on the insulating substrate layer 110 and not on the gate electrode 120.

Figure 2E:
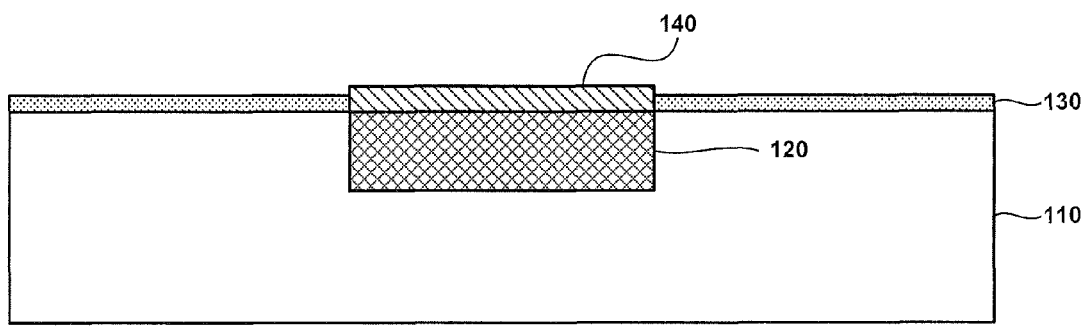

A next step is to form a gate dielectric layer on the gate electrode 120. FIG. 2E is a cross-sectional view of the structure of FIG. 2D after selectively forming a gate dielectric layer 140 on the gate electrode 120. In one embodiment, the gate dielectric layer 140 is selectively deposited or otherwise grown on the gate electrode using a chemical reactive deposition process. During this process, the dielectric material will only grow on the gate electrode 120, and not grow or otherwise be deposited on the dielectric deposition-prohibiting layer 130 in the regions of the insulating substrate layer 110 surrounding the gate electrode 120. The gate dielectric layer 140 may be formed of one or more of various types of known dielectric materials such as silicon dioxide ($SiO_2$), silicon nitride ($Si_3N_4$), hafnium oxide ($HfO_2$) or other high K (dielectric constant) materials, which are deposited by atomic layer deposition (ALD) or other chemical reactive deposition methods. The gate dielectric layer 140 may comprise a high K dielectric material, such as $TiO_2$ and $HfO_2$, etc., to increase the device transconductance. The gate dielectric layer 140 may be formed with a thickness of less than about 10 nanometers (nm), e.g., to a thickness from about three nm to about 10 nm. With this selective deposition process, the gate dielectric layer 140 can be made as thin as desired, as the thickness of the gate dielectric layer 140 is not limited by the need to cover a carbon nanotube, such as with top-gated carbon transistor structures.

Figure 2F:
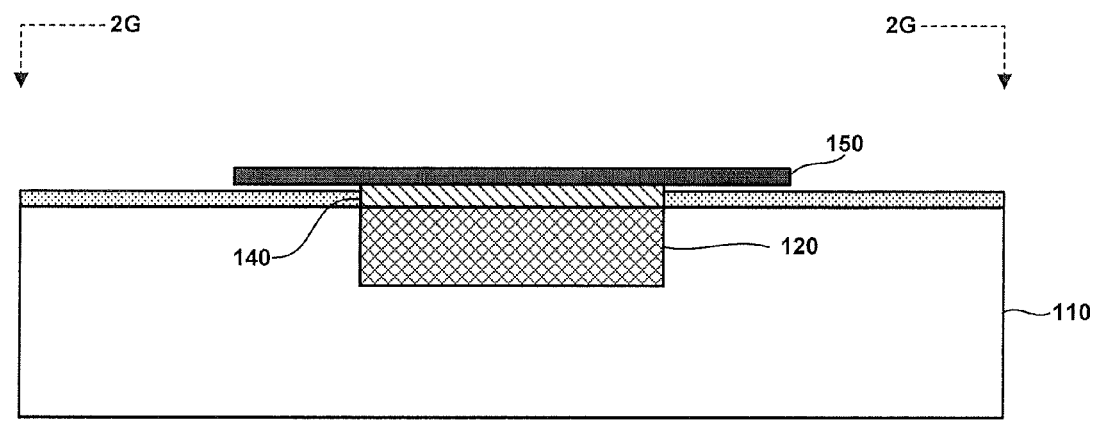
Figure 2G:
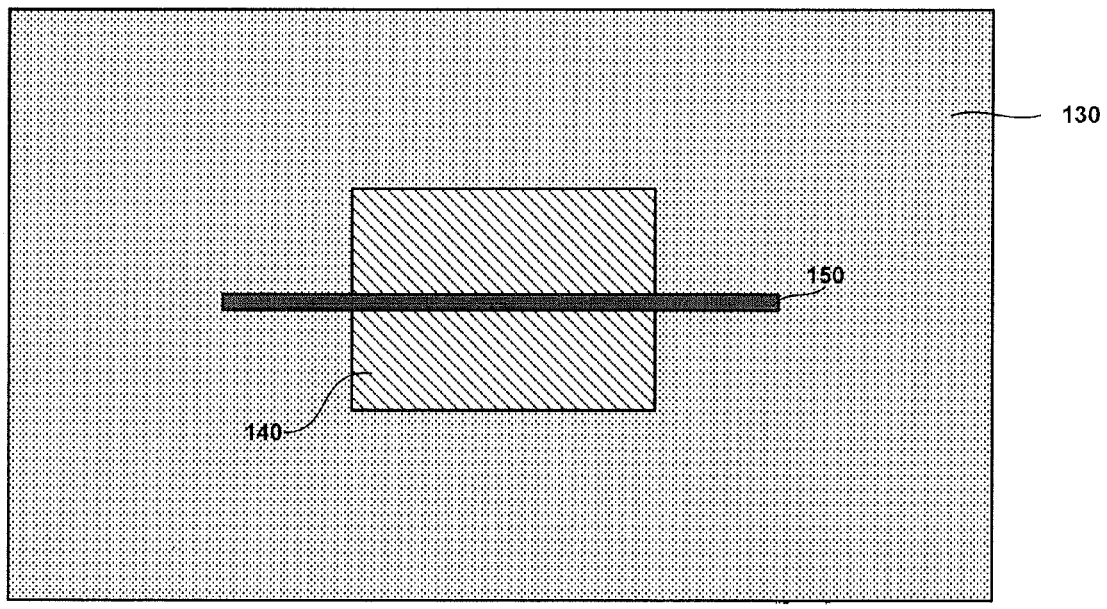

After forming the gate dielectric layer 140, one or more carbon nanostructures are placed or otherwise formed on the gate dielectric layer 140 over the gate electrode 120 to form a channel for the carbon transistor device. For example, FIG. 2F is a cross-sectional view of the structure of FIG. 2E after placing a carbon nanostructure 150 on top of the gate dielectric layer 140 and gate electrode 120. FIG. 2G is a top view of the structure shown in FIG. 2F. The carbon nanostructure 150 may be a carbon nanotube or other carbon structure that is suitable for acting as a channel of the transistor device. In one exemplary embodiment, the carbon nanostructure is a carbon nanotube that is about 1 nm in diameter and about 100 nm in length.

A variety of known methods can be used to place or otherwise form a carbon nanotube on the gate dielectric layer 140. By way of example only, transfer techniques such as transfer from a growth substrate for carbon nanotubes can be employed. These transfer processes are known to those of ordinary skill in the art and thus details of such processes are not described further herein. In other embodiments, carbon materials such as carbon nanotubes can be deposited or grown on the insulating layer using random disperse (from solution) and other known methods such as chemical vapor deposition techniques.

As shown in FIGS. 2F and 2G, the length of the carbon nanostructure 150 is longer than a length of the gate electrode 120. In this regard, the ends of the carbon nanostructure 150 extend past the side of the gate electrode 120 and gate dielectric layer 140. As discussed in below, the extended ends of the carbon nanostructure 150 are embedded within conductive material that is used to form source/drain contacts, so that sufficient electrical contact is made between the carbon nanostructure 150 (channel) and the source/drain electrodes. In one exemplary embodiment, the ends of the carbon nanostructure 150 may extend past the gate structure (140/120) in a range of about 20 nm to about 50 nm on each side Moreover, in instances where the dielectric layer 140 and dielectric deposition-prohibiting layer 130 have different thicknesses, the extended ends of the carbon nanostructure 150 will either bend up or bend down to conform to the contour of the surface formed at the transitions between different heights of the surface of the gate dielectric layer 140 and the surface of the dielectric deposition-prohibiting layer 130.

Figure 2H:
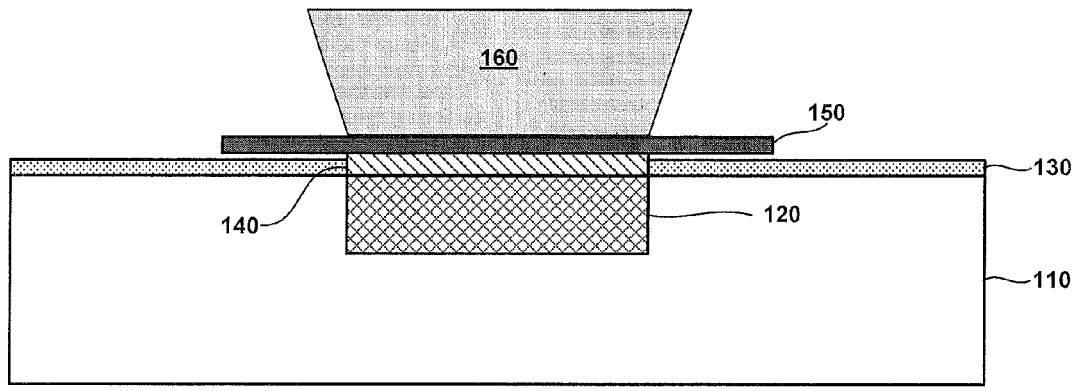

After forming the carbon nanostructure 150, a next step in the exemplary process flow involves forming a passivation layer over the gate dielectric layer 140 covering that portion of the carbon nanostructure 150 that is in contact with the gate dielectric layer 140. For example, FIG. 2H is a cross-sectional view of the structure of FIG. 2G after selectively forming a passivation dielectric layer 160 over the gate dielectric layer 140 on the gate electrode 120. With this process, an insulating/dielectric material is selectively grown on top of the gate dielectric layer 140 to form the passivation layer 160 using a chemical reactive deposition process such as ALD, where the gate dielectric layer 140 will serve as the deposition promoter for the passivation dielectric material. The passivation dielectric layer 160 may or may not be formed of the same material that is used to form the gate dielectric layer 140. For instance, the passivation dielectric layer 160 could be formed of a low-k material to reduce parasitic capacitances in the device.

With this selective deposition process, the dielectric deposition prohibiting layer 130 serves to prevent deposition and growth of the passivation dielectric layer 160 on the surface of the substrate outside the gate region. Moreover, the passivation dielectric layer 160 will not nucleate on the carbon nanostructure 150 due to inert nature of carbon material forming the carbon nanostructure 150. Although a portion of the carbon nanostructure 150 covers the gate dielectric layer 140 (as shown in FIG. 2G), during the selective deposition process, the material forming the passivation dielectric layer 160 will grow on the gate dielectric layer 140 on the sides of the carbon nanostructure 150 and then spill over to passively cover that portion of the carbon nanostructure 150 disposed on the gate dielectric layer 140. As the passivation dielectric material is selectively grown using an ALD conformal coating process, for example, the passivation dielectric layer 160 will grow laterally to some extent as it grows vertically, causing a sloped sidewall as shown in FIG. 2H. The passivation dielectric layer 160 may be formed with a thickness in a range of about 10 nm to about 40 nm thick, depending on what techniques are used to form the source/drain contacts, as discussed below.

It is to be noted that the selective deposition of the passivation dielectric layer 160 enables self-alignment of the transistor structure with regard to separation of the gate electrode and the source/drain contacts. Indeed, the pluming out of the sidewalls of the passivation dielectric layer 160 effectively serves as a spacer to prevent shorting of the source/drain contacts to the gate electrode 120, when forming the source/drain contacts using techniques as discussed hereafter.

A next step in the exemplary process flow is to form the source/drain contacts for the carbon transistor device. The source/drain contacts can be formed using one of various techniques that will now be discussed in detail with reference to FIGS. 2I, 2J, 2K and 2L. in one exemplary embodiment, prior to forming source/drain contacts, the dielectric deposition-prohibiting layer 130 can be removed using known techniques. In other embodiments, the dielectric deposition-prohibiting layer 130 can be left in place, depending on its properties.

Figure 2I:
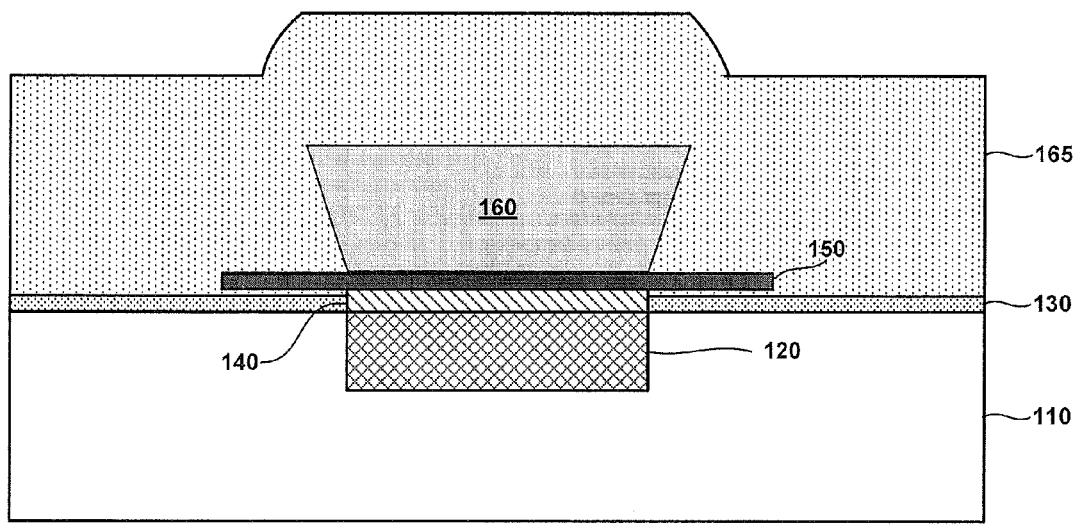
Figure 2J:
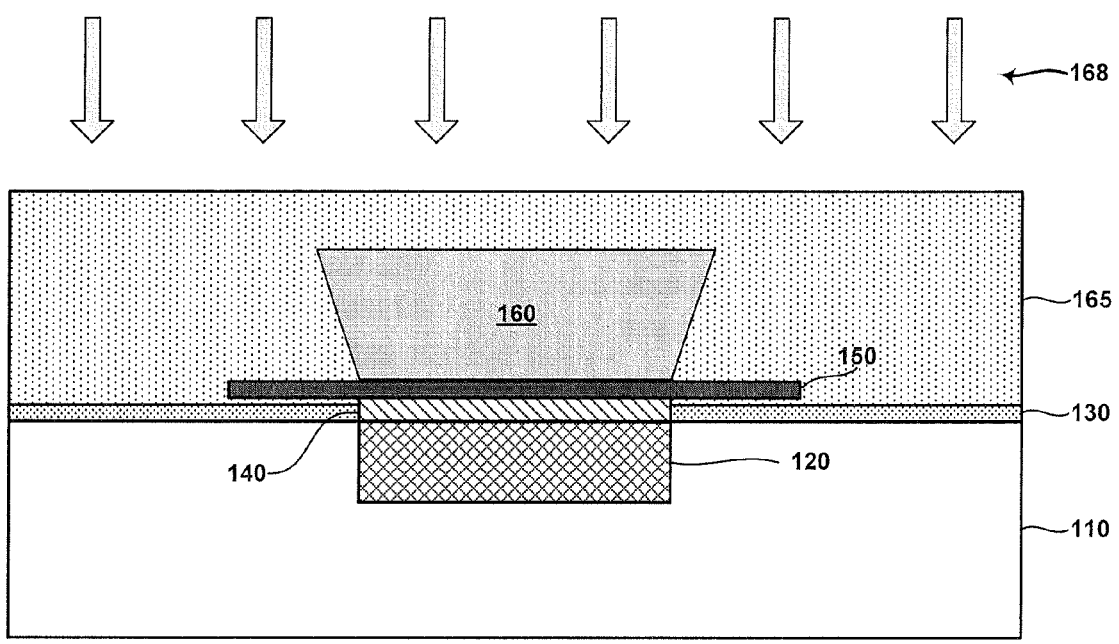

In one exemplary embodiment, the source/drain contacts can be formed using a process flow as shown in FIGS. 2I and 2J. FIG. 2I is a cross-sectional view of the structure of FIG. 2H after blanket depositing a second layer of conductive material 165 over the surface of the existing device structure, which is used to form source/drain contacts. The second layer of conductive material 165 may be one or more types of metallic materials such as tungsten (W), titanium (Yi), gold (Au), silver (Ag), molybdenum (Mo), nickel (Ni), palladium (Pd), rhodium (Rh), niobium (Ni), other suitable materials, and/or combinations thereof. The second layer of conductive material 165 may be deposited using ALD, sputtering or evaporation methods, or other suitable methods.

Next, FIG. 2J is a cross-sectional view of the structure of FIG. 2I showing the second layer of conductive material 165 being polished down to the passivation dielectric layer 160 using a chemical mechanical polishing (CMP) process 168 to form source/drain contacts 170 as shown in FIG. 1. With this CMP process, the passivation dielectric layer 160 is used as an etch stop to terminate the CMP process, thereby resulting in the structure 100 shown in FIG. 1.

Figure 2K:
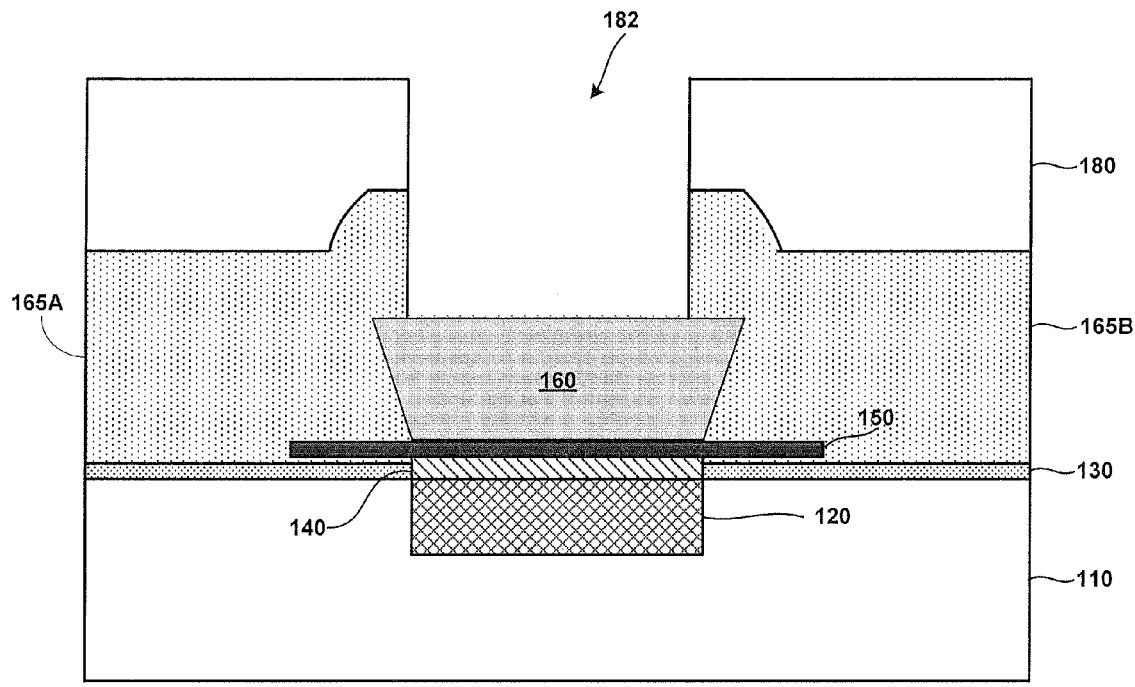

In another exemplary embodiment, the source/drain contacts can be formed using a process flow as shown in FIGS. 2I and 2K. With this process, after blanket depositing the second layer of conductive material 165 (as discussed above with reference to FIG. 2I), source/drain contacts are formed by patterning and etching the second layer of conductive material 165. For example, FIG. 2K is a cross-sectional view of the structure of FIG. 2I after forming a photolithographic mask 180 having an opening 182 aligned to the gate structures 120/140) and using the mask 180 to etch the second layer of conductive material 165 (exposed through the mask) down to the passivation dielectric layer 160 to form source/drain contacts (165A, 165B). The second layer of conductive material 165 may be etched using any etch process (such as RIE) that is suitable for etching the second layer of conductive material 165. As shown in FIG. 2K, this process results in some overlap of the source/drain contacts 165A/165B) over the gate structure (140/120). Any parasitic effects that may result from such overlap can be minimized by increasing the thickness of the passivation dielectric layer 160.

Figure 2L:
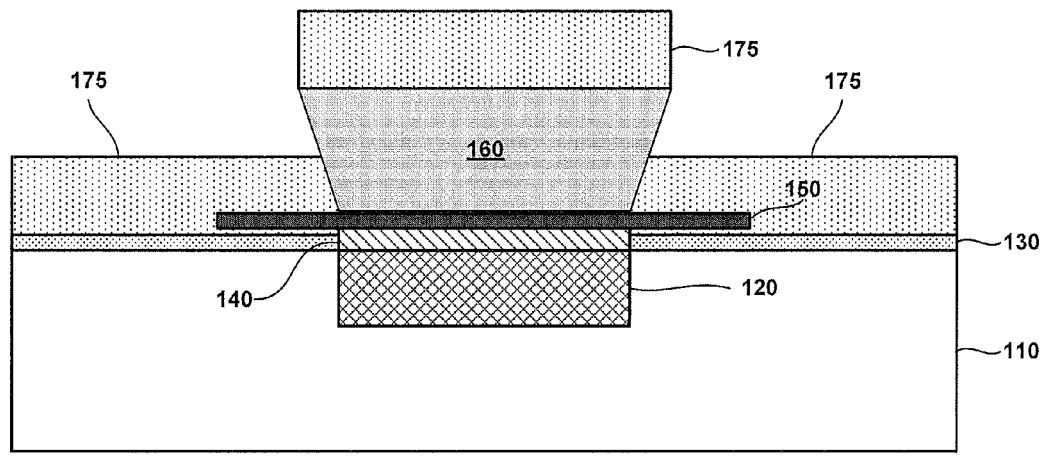

In another exemplary embodiment, the source/drain contacts can be formed using a process flow as shown in FIG. 2L. In particular, FIG. 2L is a cross-sectional view of the structure of FIG. 2H after depositing a thin layer of conductive material 175 to form separate source/drain contacts on the sides of the passivation dielectric layer 160. With this process, a conductive material can be deposited using materials and methods as discussed above with reference to FIG. 2I, but with a thickness that is less than half of the thickness of the passivation dielectric layer 160. The resulting structure shown in FIG. 2L has some conductive material 175 on top of the passivation dielectric layer 160, but this will not short the source and drain contact layers 175 on the sides of the passivation dielectric layer 160 as long as the layers 175 are thin as compared to the thickness of the passivation dielectric layer 160.

It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Further aspects of the present invention provide carbon transistor devices that can be utilized in integrated circuit chips with various analog and digital integrated circuitries. In particular, integrated circuit dies can be fabricated having carbon transistor devices and other semiconductor devices such as field-effect transistors, bipolar transistors, metal-oxide-semiconductor transistors, diodes, resistors, capacitors, inductors, etc., forming analog and/or digital circuits. The carbon transistor devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:
1. A transistor device, comprising:
   an insulating layer;
   gate electrode embedded in the insulating layer;
   a dielectric deposition-prohibiting layer formed on a surface of the insulating layer surrounding the gate electrode;
   a gate dielectric layer selectively formed on the gate electrode, wherein the gate dielectric layer comprises a first dielectric material;
   a channel structure comprising a carbon nanostructure disposed on the gate dielectric layer;
   a passivation layer selectively formed on the gate dielectric layer, covering a portion of the channel structure that is disposed on the gate dielectric layer, wherein the passivation layer comprises a second dielectric material; and
   source and drain contacts formed on opposing sides of the passivation layer in contact with the channel structure,
   wherein the dielectric deposition-prohibiting layer comprises a material that prevents chemical reactive deposition of the first and second dielectric materials on top of exposed portions of the dielectric deposition-prohibiting layer surrounding the gate electrode when the gate dielectric layer and passivation layer are selectively formed by the chemical reactive deposition of the first and second dielectric materials.

2. The device of claim 1, wherein the dielectric deposition-prohibiting layer comprises a graphene layer.

3. The device of claim 1, wherein the dielectric deposition-prohibiting layer comprises a molecular self-assembled monolayer.

4. The device of claim 1, wherein the dielectric deposition-prohibiting layer comprises a hydrophobic monolayer.

5. The device of claim 1, wherein the carbon nanostructure comprises a carbon nanotube.

6. The device of claim 1, wherein the passivation layer has sloped sidewalls.

7. The device of claim 1, wherein the channel structure comprises extended portions that extend past opposing sides of the gate dielectric layer and gate electrode.

8. The device of claim 7, wherein the extended portions of the channel structure are embedded in the source and drain contacts.

9. An integrated circuit, comprising a substrate, and a transistor device formed on the substrate, wherein the transistor device comprises:
an insulating layer;
gate electrode embedded in the insulating layer;
a dielectric deposition-prohibiting layer formed on a surface of the insulating layer surrounding the gate electrode;
a gate dielectric layer selectively formed on the gate electrode, wherein the gate dielectric layer comprises a first dielectric material;
a channel structure comprising a carbon nanostructure disposed on the gate dielectric layer;
a passivation layer selectively formed on the gate dielectric layer, covering a portion of the channel structure that is disposed on the gate dielectric layer, wherein the passivation layer comprises a second dielectric material; and
source and drain contacts formed on opposing sides of the passivation layer in contact with the channel structure,
wherein the dielectric deposition-prohibiting layer comprises a material that prevents chemical reactive deposition of the first and second dielectric materials on top of exposed portions of the dielectric deposition-prohibiting layer surrounding the gate electrode when the gate dielectric layer and passivation layer are selectively formed by the chemical reactive deposition of the first and second dielectric materials.

10. The integrated circuit of claim 9, wherein the dielectric deposition-prohibiting layer comprises a graphene layer.

11. The integrated circuit of claim 9, wherein the dielectric deposition-prohibiting layer comprises a molecular self-assembled monolayer.

12. The integrated circuit of claim 9, wherein the dielectric deposition-prohibiting layer comprises a hydrophobic monolayer.

13. The integrated circuit of claim 9, wherein the carbon nanostructure comprises a carbon nanotube.

14. The integrated circuit of claim 9, wherein the passivation layer has sloped sidewalls.

15. The integrated circuit of claim 9, wherein the channel structure comprises extended portions that extend past opposing sides of the gate dielectric layer and gate electrode.

16. The integrated circuit of claim 15, wherein the extended portions of the channel structure are embedded in the source and drain contacts.

17. The device of claim 1, wherein the first dielectric material and the second dielectric material are different dielectric materials.

18. The device of claim 1, wherein the first dielectric material and the second dielectric material are the same dielectric materials.

19. The integrated circuit of claim 9, wherein the first dielectric material and the second dielectric material are different dielectric materials.

20. The integrated circuit of claim 9, wherein the first dielectric material and the second dielectric material are the same dielectric materials.

* * * * *